United States Patent [19]
Nagashima et al.

[11] 4,258,274
[45] Mar. 24, 1981

[54] DOUBLE BALANCE TYPE SWITCHING CIRCUIT

[75] Inventors: Yoshitake Nagashima, Yokohama; Kazumasa Noyori, Oita; Hideki Moriyama, Yokohama, all of Japan

[73] Assignee: Tokyo Shibaura Denki Kabushiki Kaisha, Japan

[21] Appl. No.: 945,496

[22] Filed: Sep. 25, 1978

[30] Foreign Application Priority Data

Sep. 30, 1977 [JP] Japan .................. 52/117547

[51] Int. Cl.$^3$ .......................................... H03K 17/60
[52] U.S. Cl. .................................. 307/254; 307/355
[58] Field of Search ............... 307/254, 262, 350, 355, 307/362

[56] References Cited
U.S. PATENT DOCUMENTS 3,597,639 8/1971 Harwood .............................. 307/262
4,128,848 12/1978 Nakagawa ......................... 307/262 X Primary Examiner—John Zazworsky
Attorney, Agent, or Firm—Finnegan, Henderson, Farabow, Garrett & Dunner

[57] ABSTRACT

There is provided a double balance type switching circuit including a switching control signal generator; a first differential amplifier formed of first and second transistors; a second differential amplifier connected between the collector of the first transistor and a power supply terminal and formed of third and fourth transistors whose bases are respectively connected to the first and second output terminals of the switching control signal generator; and a third differential amplifier connected between the collector of the second transistor and the power supply terminal and formed of fifth and sixth transistors whose bases are respectively connected to the first and second output terminals of the switching control signal generator. The switching control signal generator produces from the first and second output terminals output signals whose voltage levels are different from one another and are converted between first and second levels, but during the conversion to output signals are temporarily made to have the first voltage level.

4 Claims, 10 Drawing Figures

DOUBLE BALANCE TYPE SWITCHING CIRCUIT

BACKGROUND OF THE INVENTION

This invention relates to a double balance type switching circuit. Various forms of double balance type switching circuits are already known. FIG. 1 illustrates a prior art double balance type switching circuit. A differential amplifier 4 included in this switching circuit is formed of npn transistors TR1 and TR2 whose emitters are connected together through resistors R1 and R2 and whose bases are respectively connected to signal input terminals 1 and 2; and a current source 3 connected between the junction of the resistors R1 and R2 and the ground. The collector of the transistor TR1 is connected to the common emitter of npn transistors TR3 and TR4 constituting another differential amplifier 5. The collector of the transistor TR2 is connected to the common emitter of npn transistors TR5 and TR6 constituting a third differential amplifier 6. The bases of the transistors TR3 and TR6 are connected to a switching control terminal 7. The bases of the transistors TR4 and TR5 are connected to another switching control terminal 8. The collectors of the transistors TR3 and TR5 are directly connected to a power supply terminal $V_{cc}$. The collectors of the transistors TR4 and TR6 are connected to the power supply terminal $V_{cc}$ through a resistor R3, and are also connected to the base of an npn transistor TR7 whose collector is connected to the power supply terminal $V_{cc}$ and whose emitter is grounded through a current source 9. The output terminal $V_o$ of this switching circuit is connected to the emitter of the transistor TR7.

There will now be described the operation of the prior art double balance type switching circuit of FIG. 1 by reference to the signal waveforms of FIGS. 2 to 5. The solid and broken lines of FIG. 2 respectively indicate the waveforms of switching control signals supplied to the switching control terminals 7 and 8. FIG. 3 shows the waveform of a signal supplied between the signal input terminals 1 and 2. When switching control voltage impressed on the switching control terminal 7 is higher than that supplied to the switching control terminal 8, namely, when the control voltage represented by the solid line of FIG. 2 is higher than the control voltage denoted by the broken line of FIG. 2, then the transistors TR3 and TR6 are rendered conductive, and the transistors TR4 and TR5 become nonconductive. Accordingly, the collector current of the transistor TR2 flows through the current path of the transistor TR6, now rendered conductive, and resistor R3. Conversely, when the switching control voltage supplied to the switching control terminal 7 is lower than that impressed on the switching control terminal 8, then the transistors TR4 and TR5 are rendered conductive, and the transistors TR3 and TR6 are rendered nonconductive. As the result, the collector current of the transistor TR1 runs through the current path of the transistor TR4 now rendered conductive and resistor R3. It should be noted in this case that current signals of the opposite phases corresponding to alternating voltage $V_s$ impressed across the signal input terminals 1 and 2 run through the collectors of the transistors TR1 and TR2 jointly constituting the differential amplifier 4. Therefore, current flowing through the resistor R3 when the switching control voltage supplied to the switching control terminal 7 is higher than that impressed on the switching control terminal 8 has the opposite phase of the current running through the resistor R3 where the switching control voltage supplied to the switching control terminal 7 is lower than that impressed on the switching control terminal 8. The base of the transistor TR7 is supplied with voltage corresponding to the current conducted through the resistor R3. Therefore, the emitter voltage of the transistor TR7, namely, an output voltage from the output terminal $V_o$ has the same phase as the input voltage $V_s$, where, as shown in FIG. 4, the switching control voltage supplied to the switching control terminal 7 is higher than that impressed on the switching control terminal 8, and has the opposite phase to the input voltage $V_s$, when the switching control voltage supplied to the switching control terminal 7 is lower than that impressed on the switching control terminal 8.

With the prior art double balance type switching circuit of FIG. 1 arranged as described above, proper conversion of the switching control voltage makes it possible selectively to produce an output signal having a phase the same as or opposite to that of an input signal.

However, the prior art double balance type switching circuit of FIG. 1 has the drawback that a parasitic capacitor appears in the collectors of the transistors TR1 and TR2 (a capacity prevailing between the collectors and the substrate in the IC switching circuit). A sharp drop in the switching control voltage impressed on the switching control terminal 7 (FIG. 2) leads to a sudden change in the emitter potentials of the transistors TR3, TR4, TR5 and TR6 and in consequence the collector potentials of the transistors TR1 and TR2. Such rapid variation in the collector voltage of the transistors TR1 and TR2 causes extra current to charge and discharge the above-mentioned parasitic capacitor of the transistors TR1 and TR2. The extra current is superposed on the collector current of the transistors TR1 and TR2, causing a spike voltage (FIG. 5) to occur in the resistor R3. FIG. 5 illustrates a spike voltage appearing at the output terminal $V_o$, when the signal input terminals 1 and 2 are connected together. The spike voltage grows higher, accordingly as sharper changes appear in the level of the switching control voltage impressed on the switching control terminals 7 and 8, harmfully effecting a circuit connected in the following stage of the double balance type switching circuit.

SUMMARY OF THE INVENTION

It is accordingly the object of this invention to provide a double balance type switching circuit which prevents spike voltage from being generated at the output terminal when the voltage levels of switching control signals are converted.

According to an aspect of the invention, there is provided a double balance type switching circuit comprising signal generating means which is provided with first and second output terminals, sends forth from the first output terminal a first output signal selectively chosen to have either of first and second levels, produces from the second output terminal a second output signal selectively chosen to have the other of the first and second levels, and effects level switching operation by first setting one of the first and second output signals which is now at the first level to have the second level and next setting the other of the first and second output signals to have the first level, a first differential amplifier formed of first and second transistors, a second differential amplifier connected between the collector of the first transistor and a power source and formed of third and fourth transistors whose bases are respectively connected to the first and second output terminals of the signal-generating means and a third differential amplifier connected between the collector of the second transistor and power supply terminal and formed of fifth and sixth transistors whose bases are respectively connected to the first and second output terminals of the signal-generating means.

DESCRIPTION OF THE PREFERRED EMBODIMENT

Figure 1:
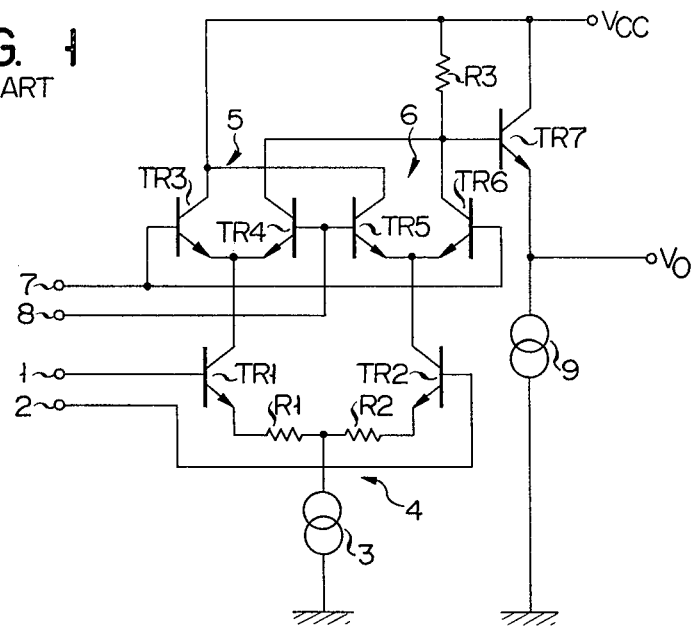
FIG. 1 shows the arrangement of a prior art double balance type switching circuit.
Figure 2:
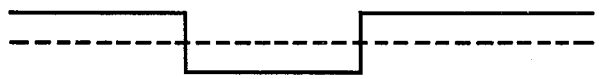
FIGS. 2 to 5 show signal waveforms for illustration of the operation of the prior art double balance type switching circuit of FIG. 1.
Figure 3:
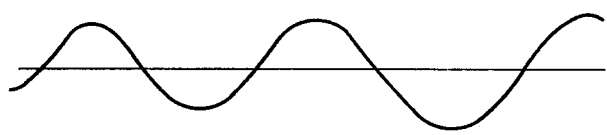
Figure 4:
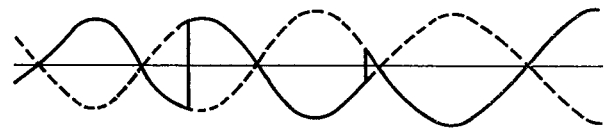
Figure 5:
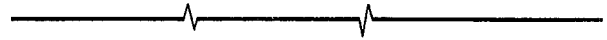
Figure 6:
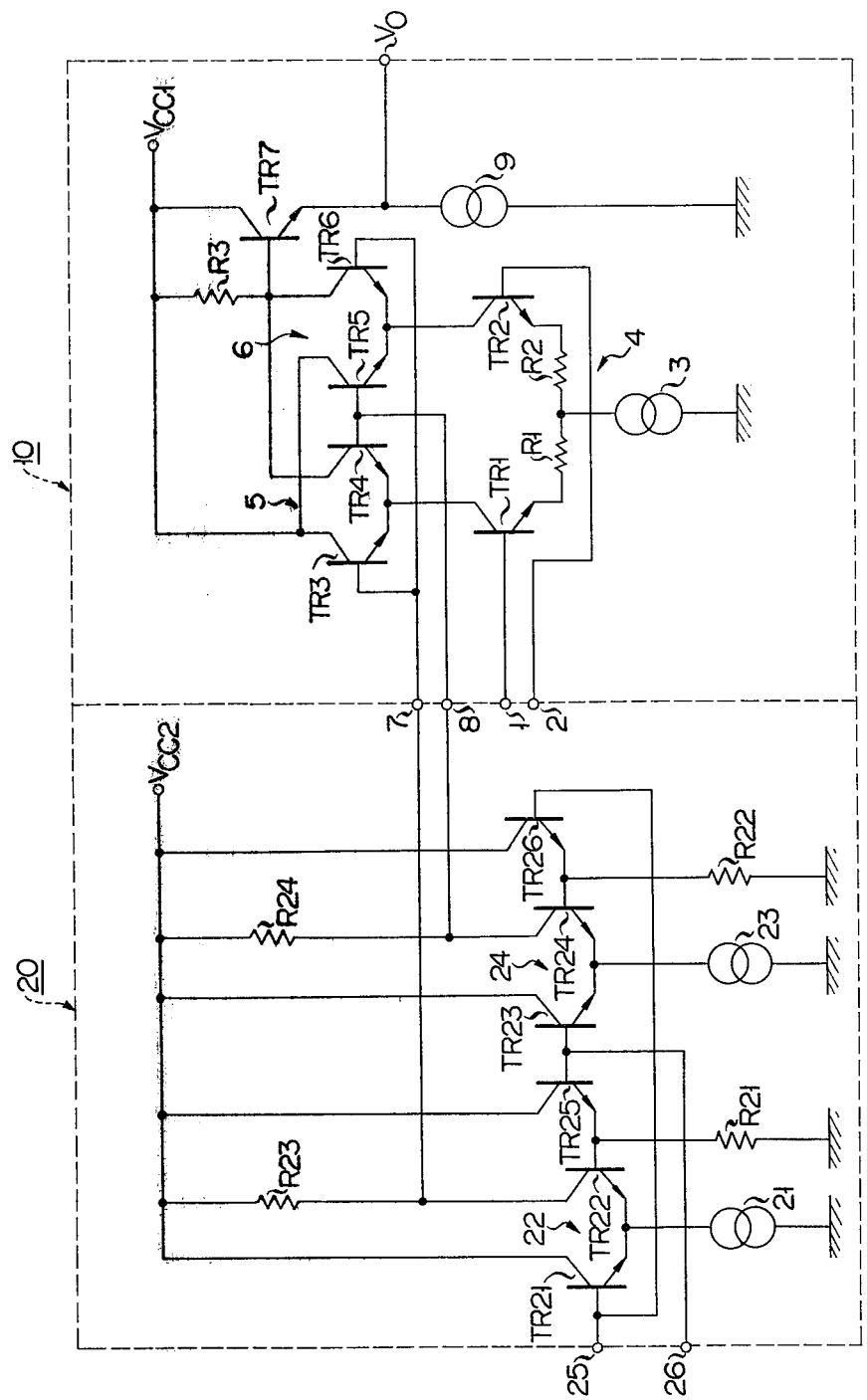
FIG. 6 indicates the arrangement of a double balance type switching circuit according to one embodiment of this invention.

There will now be described by reference to FIG. 6, a double balance type switching circuit embodying this invention. The present double balance type switching circuit includes a switching section 10 and a switching signal control section 20. The switching section 10 has the same arrangement as that of the prior art double balance type switching circuit of FIG. 1. Namely, the switching section 10 controls the voltage levels of input signals supplied to the signal input terminals 1 and 2 in accordance with switching control signals supplied to the switching control input terminals 7 and 8. The parts of FIG. 6 the same as those of FIG. 1 are respectively denoted by the same reference numeral, description thereof being omitted.

The switching signal control section 20 includes a differential amplifier 22 connected between the power supply terminal and a current source 21 and is formed of npn transistors TR21 and TR22 whose emitters are jointly connected to the current source 21; and another differential amplifier 24 formed of npn transistors TR23 and TR24 and a current source 23 connected to the emitters of the transistors TR23 and TR24. The base of the transistor TR22 is grounded through a resistor R21 and connected to the emitter of an npn transistor TR25. The base of the transistor TR24 is grounded through a resistor R22 and connected to the emitter of an npn transistor TR26. The bases of the transistors TR21 and TR26 are jointly connected to a switching control terminal 25. The bases of the transistors TR23 and TR25 are jointly connected to a switching control terminal 26. The collectors of the transistors TR21, TR23, TR25 and TR26 are connected to the power supply terminal $V_{cc2}$ to which a voltage slightly lower than a voltage applied to the power supply terminal $V_{cc1}$ is applied. The collectors of the transistors TR22 and TR24 are connected to the power supply terminal $V_{cc2}$ through the corresponding resistors R23 and R24 and also to the corresponding switching control terminals 7 and 8 of the switching section 10.

There will now be described by reference to the signal waveforms of FIGS. 7 to 10 the operation of the double balance type switching circuit of FIG. 6. The switching signal control section 20 is operated in response to switching control signals represented by the solid and broken lines of FIG. 7, which are supplied to the switching control terminals 25 and 26. Switching control output signals denoted by the solid and broken lines of FIG. 8 are sent forth to the input terminals 7 and 8 of the switching section 10.

Figure 7:
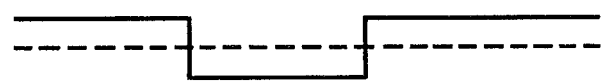
FIGS. 7 to 10 show signal waveforms for illustration of the operation of the present double balance type switching circuit of FIG. 6.
Figure 8:
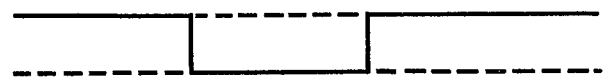
Figure 9:
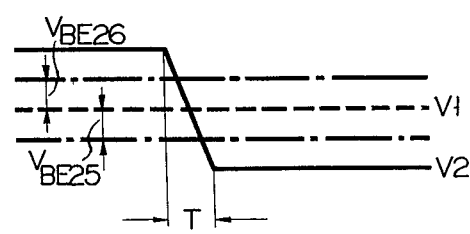

A change in the voltage level of a switching control signal denoted by the solid line of FIG. 7 for example, from high to low actually consumes a certain length of time T as shown in FIG. 9. The reference characters V1 and V2 given in FIG. 9 respectively represent the base voltages of the transistors TR25 and TR26 and the reference characters $V_{BE25}$ and $V_{BE26}$ respectively denote the off-set voltages of the transistors TR25 and TR26.

When voltage impressed on the switching control terminal 25 is higher than that supplied to the switching control terminal 26 with a difference equal to or larger than the voltage $V_{BE26}$, then the transistors TR21 and TR24 are rendered conductive, and the transistors TR22 and TR23 remain nonconductive. As seen from FIG. 10, therefore, the control signals at input terminals 7 and 8 of the switching section 10 are respectively supplied with a high voltage level control signal (solid line) and a low voltage level control signal (broken line), when a difference between the levels of switching control voltage impressed on the switching control terminal 25 and that supplied to the switch control terminal 26 becomes slightly smaller than the voltage $V_{BE26}$, then the transistor TR23 is rendered conductive and the transistor TR24 becomes nonconductive. Therefore, a switching control signal conducted to the control signal input terminal 8 of the switching section 10 has its voltage level raised. Since, at this time, the transistors TR21 and TR23 remain conductive, a switching control signal supplied to the control signal input terminal 7 continues to have a high voltage level. Where the level of switching control voltage impressed on the switching control terminal 25 falls from that of the control voltage supplied to the switching control terminal 26, and a difference between both levels of switching control voltage slightly increases over the voltage $V_{BE25}$, then the transistor TR21 is rendered nonconductive and the transistor TR22 becomes conductive. At this time, a control signal supplied to the control signal input terminal 7 has its voltage level decreased as shown by the solid line of FIG. 10. Since, at this time, the transistor TR23 remains conductive, a control signal supplied to the control signal input terminal 8 continues to have a high voltage level as indicated by the broken line of FIG. 10. As is clearly understood from FIGS. 9 and 10, control signals supplied to the control signal input terminals 7 and 8 are set to have a high voltage level during the period which extends from a point of time at which control voltage impressed on the switching control terminal 25 gets higher by the voltage $V_{BE26}$ than that supplied to the switching control terminal 26 to a point of time at which control voltage impressed on the switching control terminal 25 becomes lower by the voltage $V_{BE25}$ than that supplied to the switching control terminal 26.

Likewise when control voltage impressed on the switching control terminal 25 increases over that supplied to the switching control terminal 26 to a prescribed extent, then control signals supplied to the control signal input terminals 7 and 8 are set to have a high voltage level during part of the period of the voltage level change.

Figure 10:
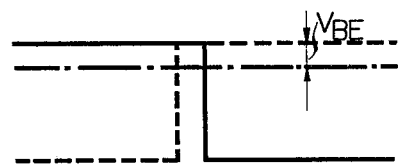

When the voltage levels of signals supplied to the signal input terminals 1 and 2 of the switching section 10 are controlled by supplying control signals represented by the solid and broken lines of FIG. 10 to the control signal input terminals 7 and 8, then the collector voltages of the transistors TR1 and TR2, namely, the emitter voltages of the transistors TR3, TR4, TR5 and TR6 do not rapidly change, when variation occurs in the level of the control voltage as indicated in FIGS. 7 or 9. Therefore, an output signal drawn out from the output terminal $V_o$ is free from a spike voltage. Namely, where change takes place in the level of the control voltage shown in FIG. 9, the collector voltages of the transistors TR1 and TR2 are maintained at a level obtained by subtracting from the higher one of the voltages of the control signal input terminals 7 and 8 the base-emitter voltage $V_{BE}$ of those transistors TR3 and TR6 or TR4 and TR5 which receive higher potential input signals. Therefore, the collector voltage of the transistors TR1 and TR2 are maintained at a prescribed level indicated by the dot-dash line of FIG. 10, whether or not change takes place in the level of control voltage impressed on the switching control terminals 25 and 26. Where control signals supplied to the control signal input terminals 7 and 8 have a high voltage level alike as shown in FIG. 10, then the waveform of an output signal from the output terminal $V_o$ does not exactly correspond to the waveforms of signals supplied to the input terminals 1 and 2. If, however, circuit elements, for example, transistors TR25 and TR26 are designed to shorten the period during which the control signals supplied to the control signal input terminals 7 and 8 have a high voltage level at the same time, then great difficulties will not arise.

Description has been given of a double balance type switching circuit embodying this invention. However, the invention is not limited to the foregoing embodiment. For example, it is possible to replace the constant current sources 3, 21, 23 by resistors, or to connect a resistor, diode or the like between the base of the transistor TR22 and switching control terminal 26 as well as between the base of the transistor TR24 and switching control terminal 25, instead of using the transistors TR25 and TR26. With the foregoing embodiment, the output terminal $V_o$ was connected to the emitter of the transistor TR7. However, it is possible to omit the transistor TR7 and connect the output terminal $V_o$ to the collectors of the transistors TR24 and TR6. The circuit of FIG. 6 comprised npn transistors, which, however, may be replaced by pnp transistors or FETs. Further, the switching signal control section 20 of FIG. 6 may be substituted by a circuit which generates an output signal having a waveform shown in FIG. 10 in response to an input signal having a waveform shown in FIG. 9.

What is claimed is:

1. A double balance type switching circuit comprising signal generating means which is provided with first and second output terminals, for sending forth from the first output terminal a first output signal selectively chosen to have either of first and second levels, for sending forth from the second output terminal a second output signal selectively chosen to have the other level, and for effecting level switching operation by (a) first setting the one of the first and second output signals which is at the first level to have the second level while keeping the other of the first and second output signals at the second level and (b) next setting the other of the first and second output signals to have the first level; a first differential amplifier formed of first and second transistors; a second differential amplifier connected between the collector of the first transistor and a power supply terminal, and formed of third and fourth transistors whose bases are respectively connected to the first and second output terminals of the signal-generating means; and a third differential amplifier connected between the collector of the second transistor and the power supply terminal, and formed of fifth and sixth transistors whose bases are respectively connected to the first and second output terminals of the signal-generating means.

2. The double balance type switching circuit according to claim 1, wherein the first to the sixth transistors are of the npn type; and the first voltage level of an output signal from the signal-generating means is chosen to be lower than the second voltage level.

3. The double balance type switching circuit according to claim 1, wherein the emitters of the first and second transistors are connected to a power source through corresponding first and second resistors; the collectors of the third and fifth transistors are directly connected to the power supply terminal; and the collectors of the fourth and sixth transistors are connected to the power supply terminal through a third resistor.

4. The double balance type switching circuit according to claim 1, 2 or 3, wherein the signal-generating means further comprises a fourth differential amplifier formed of seventh and eighth transistors; a fifth differential amplifier formed of ninth and tenth transistors; an eleventh transistor whose emitter is connected to the base of the eighth transistor; and a twelfth transistor whose emitter is connected to the base of the tenth transistor and whose base is connected to the base of the seventh transistor, and the first and second output terminals are connected to the collectors of the eighth and tenth transistors.

* * * * *